(12) United States Patent
Wang et al.

(10) Patent No.: US 10,051,739 B2
(45) Date of Patent: Aug. 14, 2018

(54) CONTROL RELAY BOARD FOR RAILWAY VEHICLE

(71) Applicant: CRRC QINGDAO SIFANG CO., LTD., Qingdao, Shandong (CN)

(72) Inventors: Hongbo Wang, Shandong (CN); Yongzhen Qin, Shandong (CN); Lin Tao, Shandong (CN); Kexiao Wang, Shandong (CN); Jinghai Jiao, Shandong (CN); Li Wang, Shandong (CN)

(73) Assignee: CRRC QINGDAO SIFANG CO., LTD., Qingdao, Shandong (CN)

( * ) Notice: Subject to any disclaimer, the term of this patent is extended or adjusted under 35 U.S.C. 154(b) by 0 days.

(21) Appl. No.: 15/512,547

(22) PCT Filed: Nov. 12, 2015

(86) PCT No.: PCT/CN2015/094416
§ 371 (c)(1),
(2) Date: Mar. 18, 2017

(87) PCT Pub. No.: WO2016/110158
PCT Pub. Date: Jul. 14, 2016

(65) Prior Publication Data
US 2017/0295646 A1  Oct. 12, 2017

(30) Foreign Application Priority Data

Jan. 5, 2015 (CN) .......................... 2015 1 0001422
Jan. 5, 2015 (CN) ..................... 2015 2 0004797 U

(51) Int. Cl.
*H05K 1/11* (2006.01)
*H05K 1/14* (2006.01)
(Continued)

(52) U.S. Cl.
CPC ............. *H05K 1/141* (2013.01); *B61C 17/00* (2013.01); *H05K 7/10* (2013.01); *H01R 13/6616* (2013.01);
(Continued)

(58) Field of Classification Search
CPC ............ H01R 13/6616; H01R 13/6625; H01R 13/6658; H01R 23/7073; H01R 23/7005;
(Continued)

(56) References Cited

U.S. PATENT DOCUMENTS 5,822,197 A * 10/1998 Thuault ................ H05K 7/1407
361/740
6,498,731 B1 * 12/2002 Roscoe ................ H05K 7/1408
361/741
2007/0075437 A1    4/2007 Nishimura et al.

FOREIGN PATENT DOCUMENTS

CN         102034793 A      4/2011
CN         102195241 A      9/2011
(Continued)

OTHER PUBLICATIONS

International Search Report for PCT/CN2015/094416, dated Feb. 17, 2016, ISA/CN.

*Primary Examiner* — Binh Tran
(74) *Attorney, Agent, or Firm* — U.S. Fairsky LLP; Yue Xu

(57) ABSTRACT

A rail vehicle control relay board includes a main frame, a mother board and a daughter board assembly which are arranged in the main frame, the main frame includes a board face mounting frame and a daughter board mounting frame which protrudes from the board face mounting frame, the mother board is arranged in the board face mounting frame, and multiple daughter board assemblies perpendicular to the mother board are arranged side by side in the daughter board mounting frame, the daughter board assemblies are electri-
(Continued)

cally connected to the mother board, and multiple first connectors configured to perform output outwards are arranged on the mother board. The rail vehicle control relay board has a high strength, and may reduce the daughter board loosening faults, extend a wiring space and increase the number of relays arranged.

18 Claims, 10 Drawing Sheets

(51) Int. Cl.
  *B61C 17/00* (2006.01)
  *H05K 7/10* (2006.01)
  *H01R 13/66* (2006.01)
  *H01R 13/05* (2006.01)
  *H01R 12/50* (2011.01)
  *H05K 7/14* (2006.01)

(52) U.S. Cl.
  CPC ...... *H01R 13/6625* (2013.01); *H01R 13/6658* (2013.01); *H01R 23/7073* (2013.01); *H05K 1/14* (2013.01); *H05K 7/1439* (2013.01)

(58) Field of Classification Search
  CPC ........ H05K 1/141; H05K 1/14; H05K 7/1439; H05K 2201/044; H05K 13/0015; H05K 13/0452; H05K 2203/167; H05K 7/1418; H05K 7/1454
  USPC ....... 361/784, 785, 786, 787, 788, 789, 791, 361/796, 802, 803; 439/620.1, 620.11, 439/620.12, 620.13, 620.15, 620.16, 825, 439/826
  See application file for complete search history.

(56) References Cited

FOREIGN PATENT DOCUMENTS

| | | |
|---|---|---|
| CN | 202009161 U | 10/2011 |
| CN | 104590289 A | 5/2015 |
| CN | 204355049 U | 5/2015 |
| JP | 2010223774 A | 10/2010 |
| JP | 2012016177 A | 1/2012 |

* cited by examiner

CONTROL RELAY BOARD FOR RAILWAY VEHICLE

This application is the national phase of International Application No. PCT/CN2015/094416, titled "CONTROL RELAY PANEL FOR RAILWAY VEHICLE", filed on Nov. 12, 2015, which the benefits of priorities to Chinese patent application No. 201510001422.5, titled "RAIL VEHICLE CONTROL RELAY BOARD", filed with the Chinese State Intellectual Property Office on Jan. 5, 2015 and Chinese patent application No. 201520004797.2, titled "RAIL VEHICLE CONTROL RELAY BOARD", filed with the Chinese State Intellectual Property Office on Jan. 5, 2015, the entire disclosures of which applications are incorporated herein by reference.

FIELD

The present application relates to a relay board, and particularly to a rail vehicle control relay board.

BACKGROUND

A control relay board used in a motor train unit employs the structure of a mother board and daughter boards. Both of the mother board and the daughter boards employ circuit boards for layout. Elements such as relays, diodes are arranged on the daughter boards, and the daughter boards are connected to the mother board by connectors. A pressure plate structure is adopted to press the daughter boards on a frame of the control relay board uniformly. A time relay and other elements are arranged on a board surface of the control relay board. Routes of the elements arranged on the board face and routes of the mother board are all connected by the connectors on the board surface, and the connectors are external electric interfaces of the control relay board.

The pressure plate structure of the control relay board of this type has some deficiencies. The pressure plate structure and the daughter boards are apt to be deformed, and the daughter boards are apt to be caused to loosen, thereby resulting in electric system faults, therefore the pressure plate structure cannot meet the requirements of industrialized electric equipment.

SUMMARY

For addressing the above issues and deficiencies, a main object of the present application to provide a rail vehicle control relay board which has a high strength, and can reduce the daughter board loosening fault, extend a wiring space and increase the number of relays arranged.

To achieve the above object, technical solutions of the present application are as follows.

A rail vehicle control relay board includes a main frame, a mother board and a daughter board assembly which are arranged in the main frame, the main frame includes a board face mounting frame and a daughter board mounting frame which protrudes from the board face mounting frame, the mother board is arranged in the board face mounting frame, and multiple daughter board assemblies perpendicular to the mother board are arranged side by side in the daughter board mounting frame, the daughter board assemblies are electrically connected to the mother board, and multiple first connectors configured to perform output outwards are arranged on the mother board.

Further, the daughter board mounting frame includes a cuboidal frame, the cuboidal frame and the board face mounting frame are integrally formed, and a plurality of sliding groove assemblies for inserting the daughter board assemblies are arranged side by side in the cuboidal frame.

Further, the board face mounting frame includes a square box shaped body, and a bottom side of the square box-shaped body is a dismountable bottom board, and the mother board is connected inside the square box-shaped body by bolting.

Further, each of the sliding groove assemblies includes four sliding groove bodies, and side surfaces at two sides facing each other of the daughter board mounting frame are each provided with two sliding groove bodies, and each of the sliding groove bodies is provided with a guide rail used for inserting the daughter board assembly.

Further, the daughter board assembly includes a first daughter board and a second daughter board, the first daughter board and the second daughter board are in parallel with each other, a daughter board mounting panel is provided on a same side of the first daughter board and the second daughter board, and the daughter board mounting panel is fixed to the first daughter board and the second daughter board by bolting, respectively.

Further, the daughter board mounting panel is provided with two fixing faces which are in parallel with the first daughter board and the second daughter board respectively, and the first daughter board and the second daughter board are fixed to the two fixing faces by bolting, respectively.

Further, the daughter board mounting panel is fixed to the daughter board mounting frame by bolting.

Further, multiple support columns are provided between the first daughter board and the second daughter board, two ends of each of the support columns are each provided with a threaded hole, and the two ends of each of the support columns abut against the first daughter board and the second daughter board respectively, and the first daughter board and the second daughter board fix the support columns by bolts.

Further, the first daughter board is in circuit connection with the second daughter board by second connectors.

Further, the first daughter board or the second daughter board is electrically connected to the mother board by a third connector.

Further, multiple first connectors are further provided on the board face mounting frame, part of the plurality of daughter board assemblies are electrically connected to the mother board, and the other daughter board assemblies are electrically connected to the first connectors on the board face mounting frame by conducting wires.

In conclusion, by the mounting structure of the daughter boards, the rail vehicle control relay board according to the present application has an improved mounting strength, an enlarged wiring space, an increased number of the relays arranged and reduced loosening faults of the daughter boards. Also, the daughter boards employ a double-board structure, and double boards of the double-board structure reinforce each other, thus improving the strength of the daughter boards. The support columns are additionally provided between the double boards, which further increases the strength of the double boards. It is convenient to mount and dismount the daughter board assemblies. The first connectors configured to perform output outwards are also provided on the board face mounting frame, and part of the daughter board assemblies are electrically connected to the mother board, and performs output outwards via the first connectors on the mother board, and the other daughter board assemblies are electrically connected to the first connectors on the board face mounting frame by conducting wires, thus improving the versatility of the relay board.

BRIEF DESCRIPTION OF THE DRAWINGS

For more clearly illustrating embodiments of the present application or technical solutions in the conventional technology, drawings referred to describe the embodiments or the conventional technology will be briefly described hereinafter. Apparently, the drawings in the following description are only some examples of the present application, and for those skilled in the art, other drawings may be obtained based on these drawings without any creative efforts.

Figure 1:
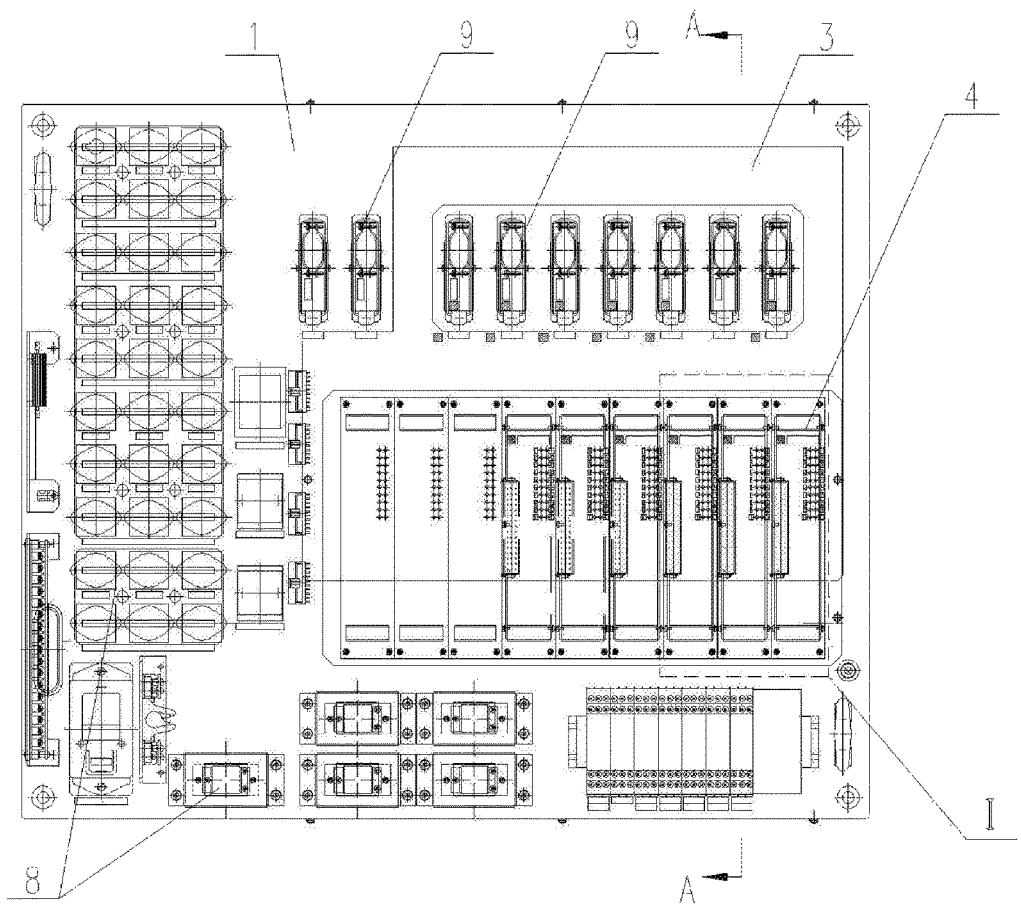
FIG. 1 is a schematic view showing the structure of the present application.
Figure 2:
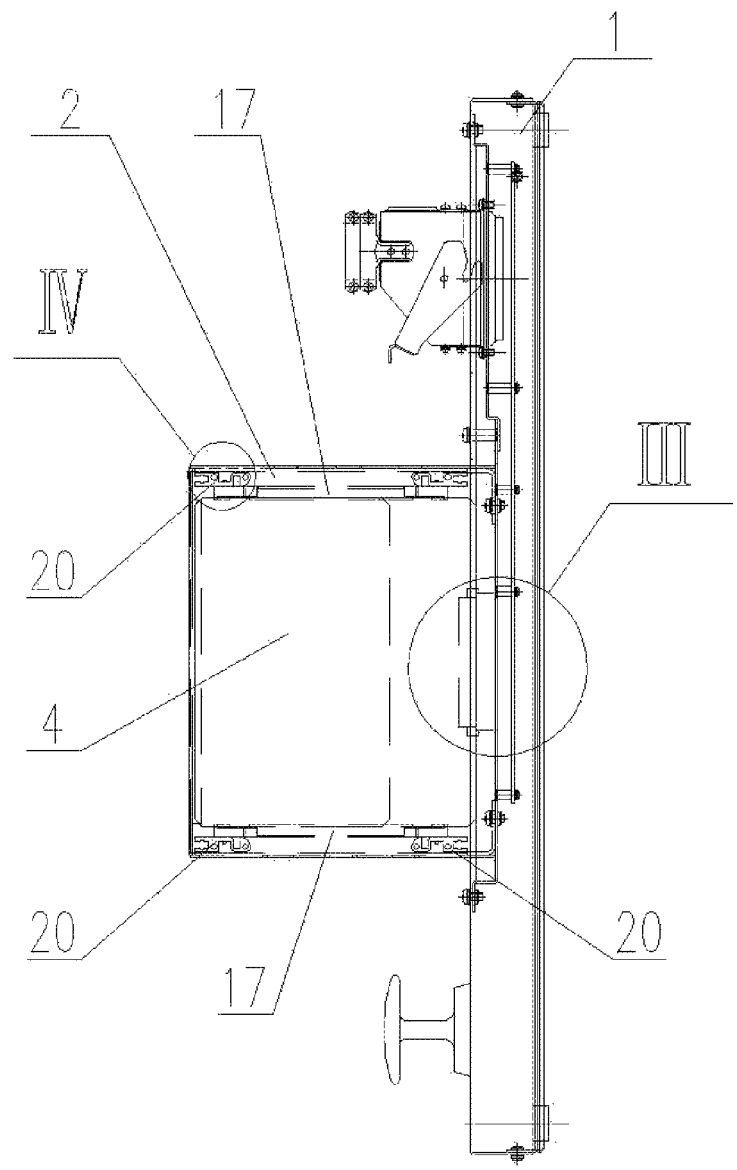
FIG. 2 is a sectional view of FIG. 1 taken along side A-A.
Figure 3:
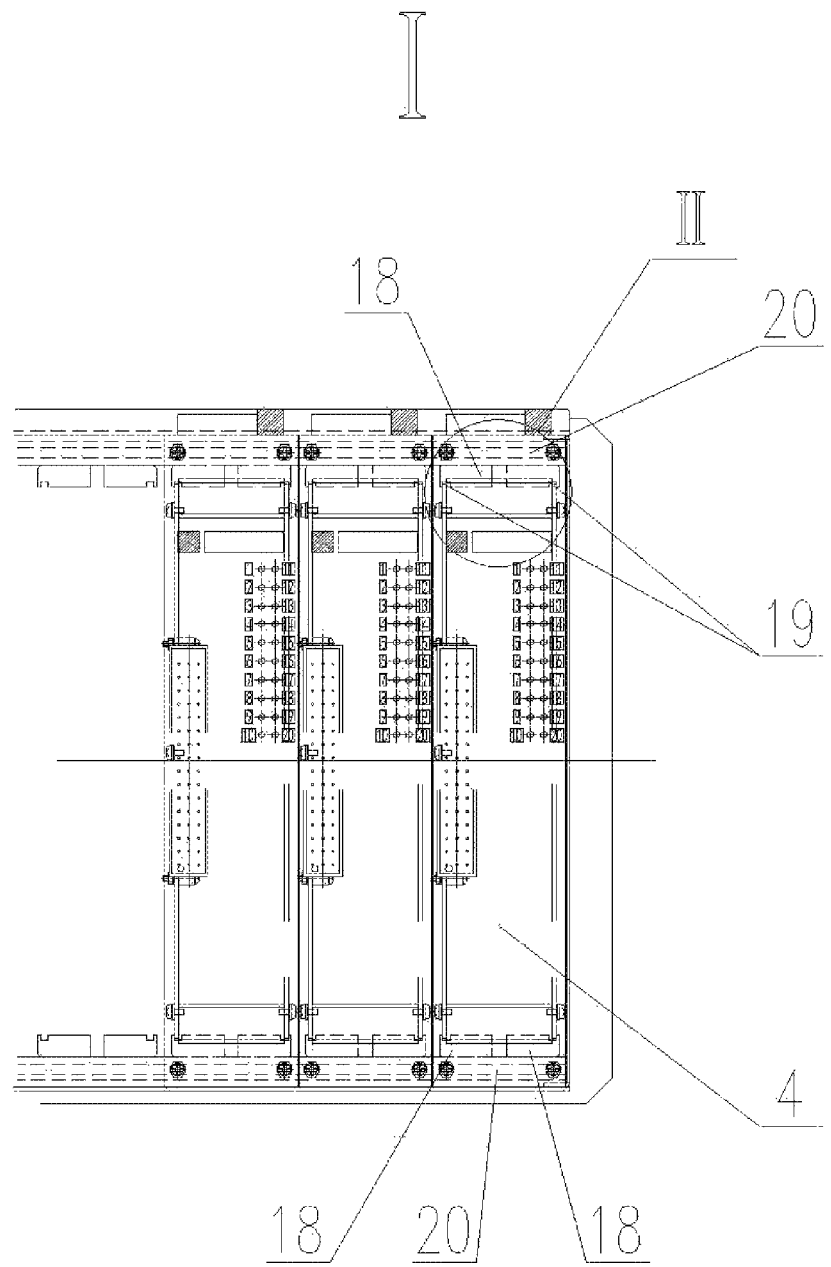
FIG. 3 is an enlarged view of part I in FIG. 1.
Figure 4:
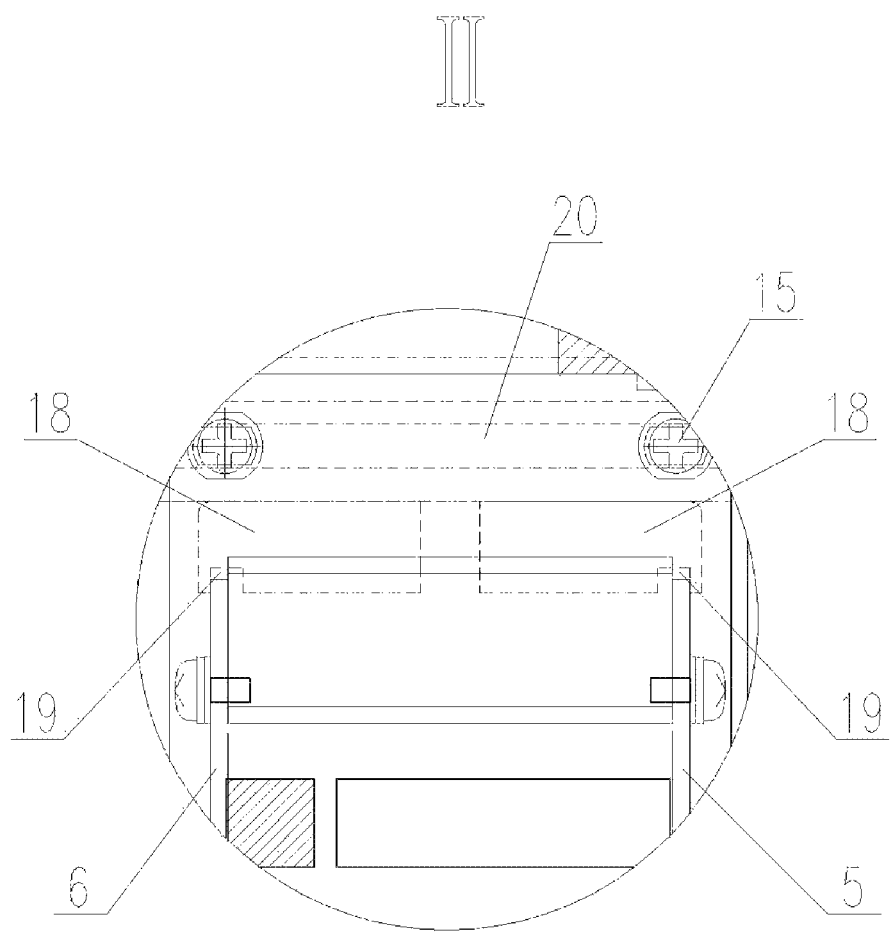
FIG. 4 is an enlarged view of part II in FIG. 3.
Figure 5:
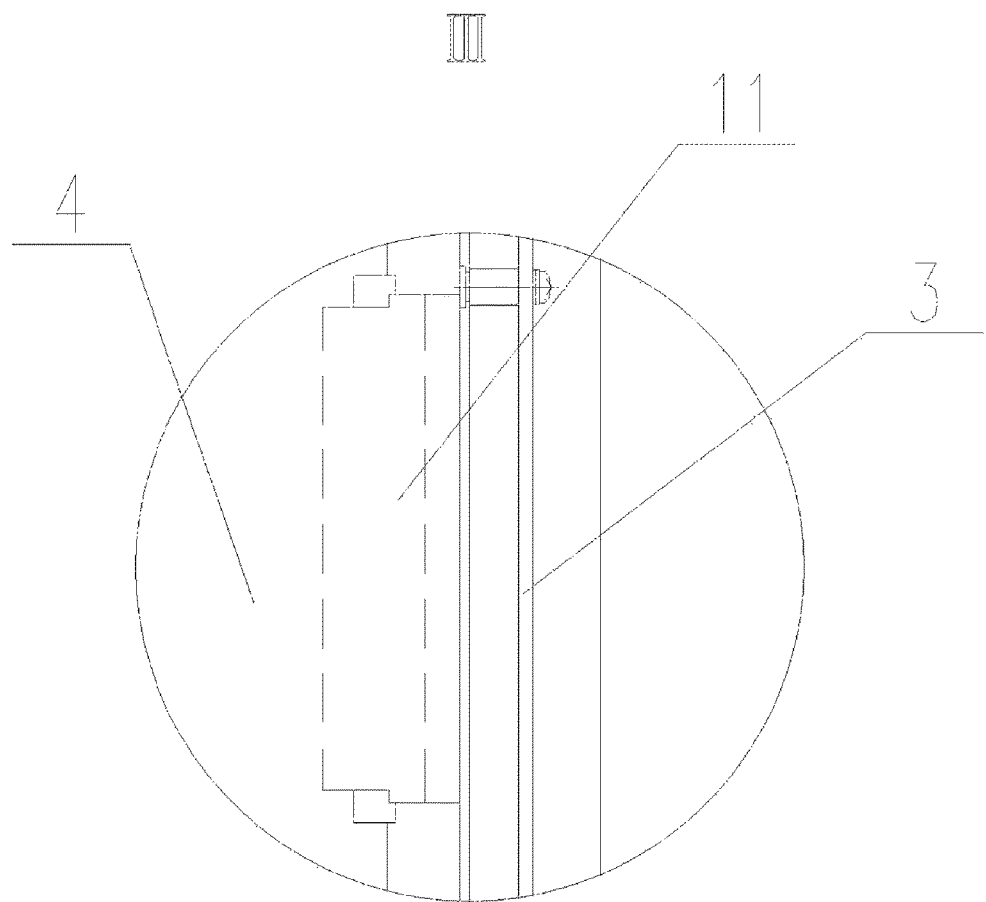
FIG. 5 is an enlarged view of part III in FIG. 2.

Reference numerals in FIGS. 1 to 10:

| | |
|---|---|
| 1 | board face mounting frame, |
| 2 | daughter board mounting frame, |
| 3 | mother board, |
| 4 | daughter board assembly, |
| 5 | first daughter board, |
| 6 | second daughter board, |
| 7 | daughter board mounting panel, |
| 8 | relay, |
| 9 | first connector, |
| 10 | second connector, |
| 11 | third connector, |
| 12 | conducting wire, |
| 13 | knob, |
| 14 | daughter board serial number, |
| 15 | daughter board fixing screw, |
| 16 | fault indicating lamp, |
| 17 | sliding groove assembly, |
| 18 | sliding groove body, |
| 19 | guide rail, |
| 20 | sliding groove body mounting seat, |
| 20-1 | fixing hole, |
| 20-2 | mounting hole, |
| 20-3 | panel mounting hole, |
| 21 | fixing face, and |
| 22 | support column. |

DETAILED DESCRIPTION

To make the objects, technical solutions and advantages of the embodiments of the present application more clear, the technical solutions of the embodiments of the present application will be clearly and completely described hereinafter in conjunction with the drawings of the embodiments of the present application. Apparently, the embodiments described are some embodiments of the present application, rather than all embodiments. Other embodiments obtained by those skilled in the art based on the embodiments of the present application without any creative efforts all fall into the protection scope of the present application.

The present application is described in detail hereinafter in conjunction with drawings and embodiments.

First Embodiment

As shown in FIGS. 1 to 6, a rail vehicle control relay board includes a main frame, the main frame includes a board face mounting frame 1 and a daughter board mounting frame 2, which protrudes from the board face mounting frame 1.

The board face mounting frame 1 includes a square box shaped body, a bottom side of which is a dismountable bottom board. A mother board 3 is connected inside the square box shaped body by bolting, and the arrangement of the bottom board is convenient for mounting and dismounting of the mother board 3.

The daughter board mounting frame 2 is arranged on one side of the square box shaped body. The daughter board mounting frame 2 protrudes from the board face mounting frame 1 and is perpendicular to the board face mounting frame 1. The daughter board mounting frame 2 includes a cuboidal frame, which is integrally formed with the board face mounting frame 1. Multiple sliding groove assemblies 17 for the insertion of daughter board assemblies 4 are arranged side by side in the cuboidal frame. The arrangement structure of the daughter board mounting frame 2 improves the mounting strength of daughter boards, and prevents the daughter boards from loosening and deforming.

The mother board 3 is arranged inside the board face mounting frame 1, and multiple first connectors 9 are provided on the mother board 3. The first connectors 9 are configured for external output of the relay board. The daughter board assembly 4 is configured for arranging electric elements such as relays 8, fault indicating lamps 16. The mother board 3 is only configured for wiring.

The daughter board assembly 4 is arranged in the daughter board mounting frame 2. Multiple daughter board assemblies 4 are provided, the multiple daughter board assemblies 4 are arranged side by side in the daughter board mounting frame 2, and the multiple daughter board assemblies 4 are perpendicular to the mother board 3 after being mounted in the daughter board mounting frame 2. The daughter board assemblies 4 are perpendicular to the mother board 3 and match with the structure of the daughter board mounting frame 2 after being mounted in the daughter board mounting frame 2, which improves the strength of the daughter board assemblies 4, and reduces a loosening fault rate of the daughter boards.

As shown in FIGS. 2, 3, 4 and 6, multiple sliding groove assemblies 17 for the insertion of the daughter board assemblies 4 are provided side by side in the cuboidal frame of the daughter board mounting frame 2. Each sliding groove assembly 17 includes four sliding groove bodies 18, and lateral sides at two sides facing each other of the daughter board mounting frame 2 are each provided with two sliding groove bodies 18, and two full-length sliding groove body mounting seats 20 perpendicular to the sliding groove bodies 18 are provided at each of the lateral sides at the two sides of the daughter board mounting frame 2. Each sliding groove body mounting seat 20 is fixed to the cuboidal frame of the daughter board mounting frame 2 by bolting via fixing holes 20-1 provided in the sliding groove body mounting seat 20. The two sliding groove body mounting seats 20 are respectively arranged at positions on a top portion and a bottom portion of the sliding groove bodies 18, and each of the sliding groove bodies 18 is fixed to the sliding groove body mounting seat 20 by bolting via a mounting hole 20-2 provided in the sliding groove body mounting seat 20. Each sliding groove body 18 is provided with two guide rails 19 for inserting the daughter board assembly 4, and the arrangement of the sliding groove assemblies 17 facilitates the mounting and dismounting of the daughter board assemblies 4.

Figure 7:
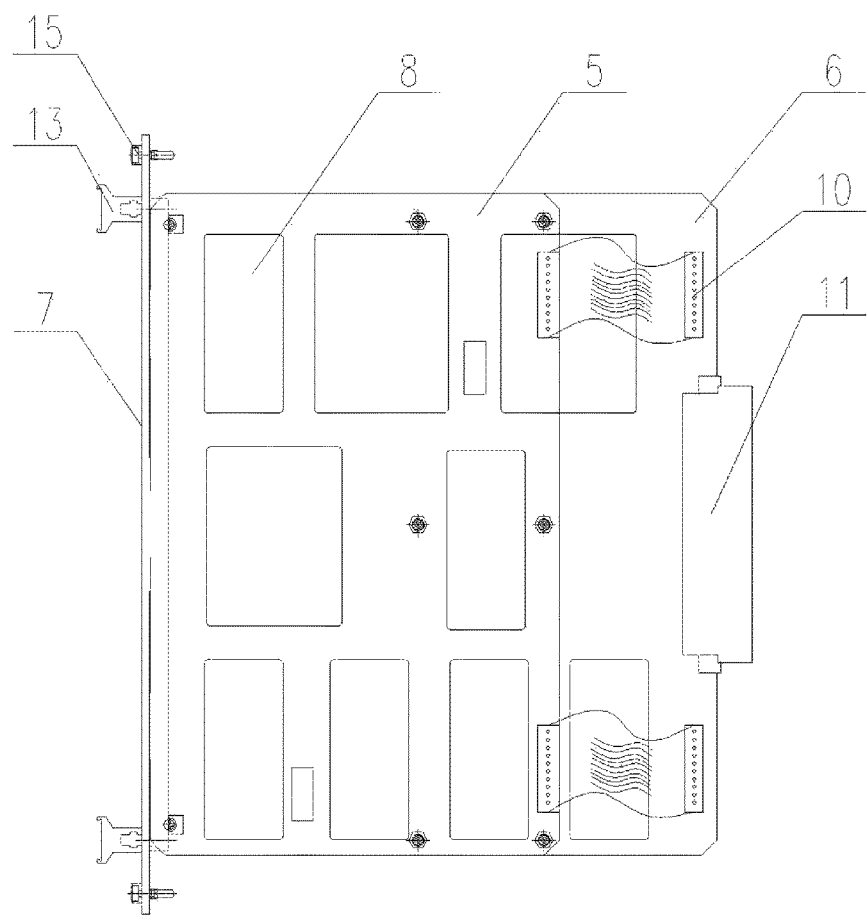
FIG. 7 is a schematic view showing the structure of a daughter board assembly according to the present application.
Figure 8:
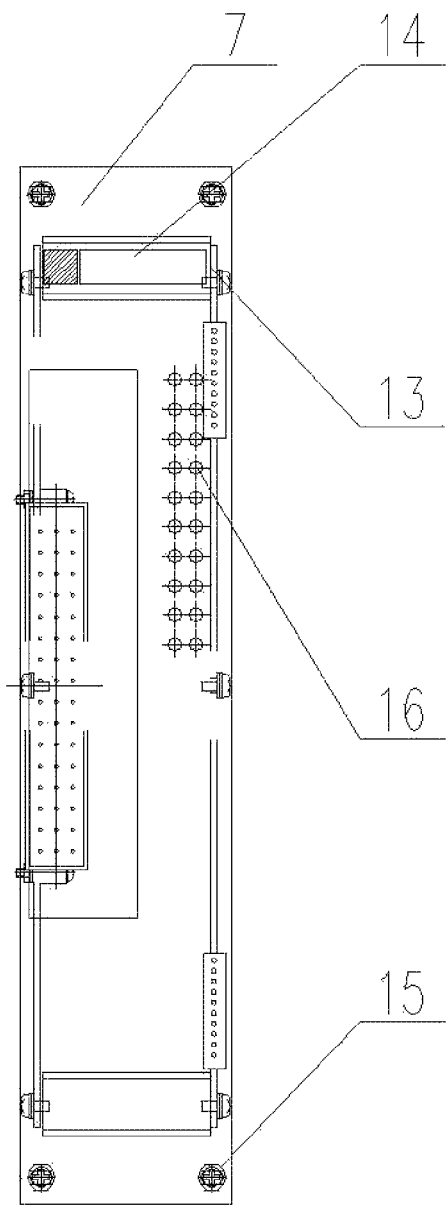
FIG. 8 is a left view of FIG. 7.
Figure 8:
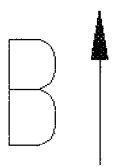
Figure 9:
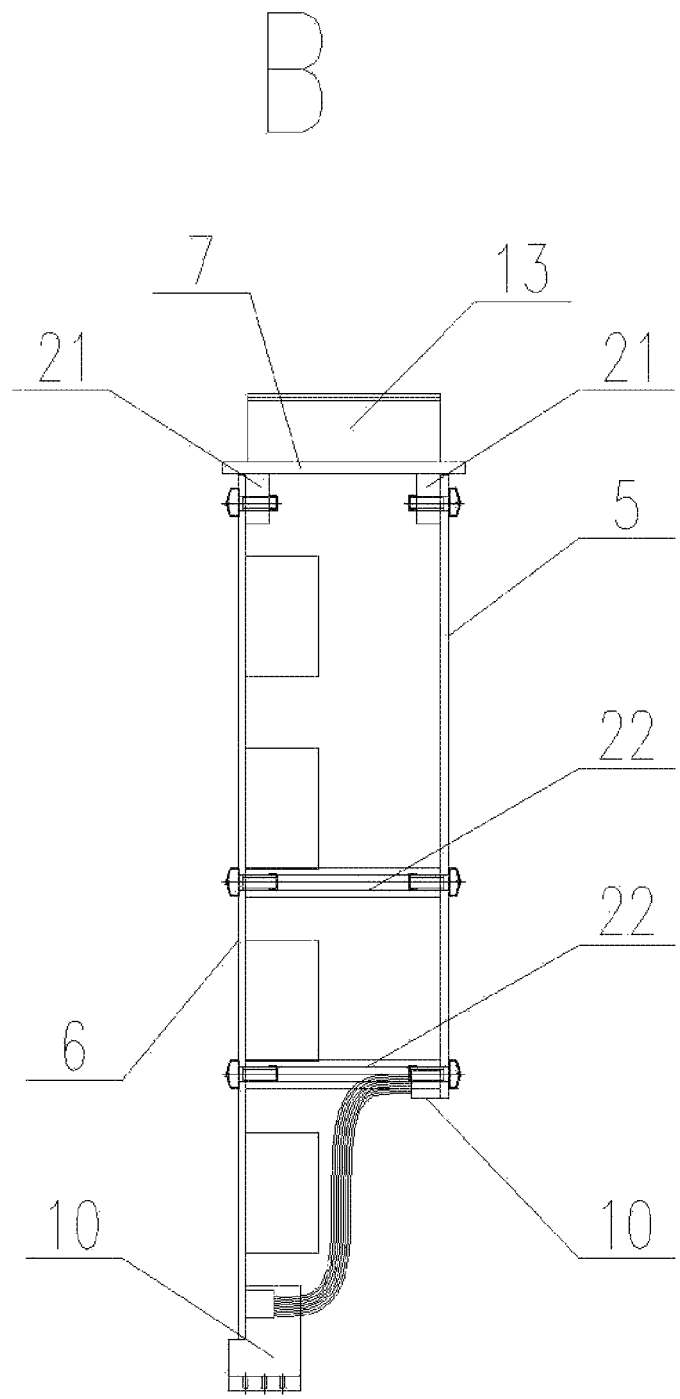
FIG. 9 is a view of FIG. 8 viewed from direction B.

As shown in FIGS. 7 to 9, the daughter board assembly 4 is a double-board structure, and includes a first daughter board 5 and a second daughter board 6. The first daughter board 5 and the second daughter board 6 are in parallel with each other. A daughter board mounting panel 7 is provided at the same side of the first daughter board 5 and the second daughter board 6, and the daughter board mounting panel 7 is fixed to the first daughter board 5 and the second daughter board 6 by bolting respectively. The daughter board mounting panel 7 is perpendicular to double boards. At a back side of the daughter board mounting panel 7, i.e., at a side of the daughter board mounting panel 7 in contact with the double boards, two fixing faces 21 are provided, and the two fixing faces 21 are in parallel with the first daughter board 5 and the second daughter board 6 respectively, and the first daughter board 5 and the second daughter board 6 are fixed to the two fixing faces 21 by bolting respectively. The daughter board mounting panel 7 functions to fix the first daughter board 5 and the second daughter board 6, and allows the first daughter board 5 and the second daughter board 6 to be in parallel with each other. The daughter boards employ the double-board structure, and the double boards of the double-board structure reinforce each other, thus improving the strength of the daughter board assembly 4.

Six support columns 22 are arranged between the first daughter board 5 and the second daughter board 6. Two ends of each support column 22 are each provided with a threaded hole. The two ends of each support column 2 abut against the first daughter board 5 and the second daughter board 6 respectively, and the support columns 22 are fixed to the first daughter board 5 and the second daughter board 6 by bolts respectively. By providing multiple support columns 22, the strength of the first daughter board 5 and the second daughter board 6 is further improved.

Figure 6:
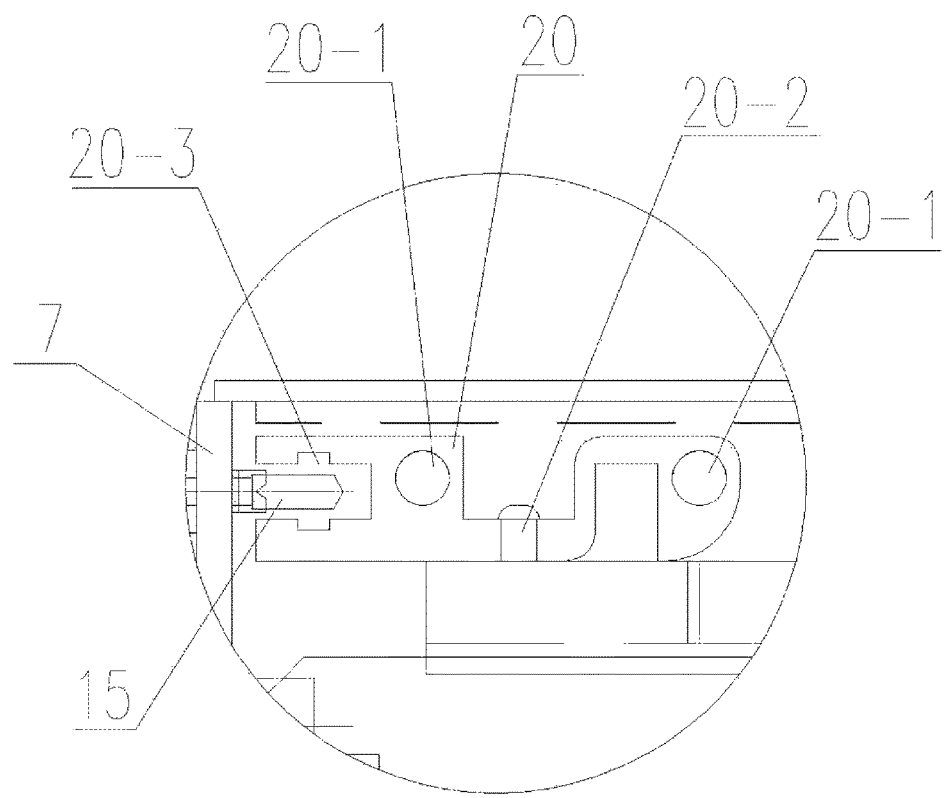
FIG. 6 is an enlarged view of part IV in FIG. 2.

As shown in FIGS. 6 and 7, four through holes are provided in the daughter board mounting panel 7, panel mounting holes 20-3 are provided in the full-length sliding groove body mounting seat 20, and four daughter board fixing screws 15 are provided to pass through the four through holes and are fixed in the panel mounting holes 20-3, thus fixing the daughter board mounting panel 7 to the daughter board mounting frame 2. Specifically, the daughter board mounting panel 7 is fixed to the sliding groove body mounting seats 20 on the daughter board mounting frame 2. The daughter board fixing screws 15 are anti-loosening screws.

The first daughter board 5 and the second daughter board 6 are fixed to the daughter board mounting panel 7 by bolting to achieve the assembling of the daughter board assembly 4. The daughter board assembly 4 is inserted into the sliding groove assembly 17 of the daughter board mounting frame 2. When the double boards fixed by the daughter board mounting panel 7 are inserted into the sliding groove assembly 17, two sides of the first daughter board 5 and two sides of the second daughter board 6 may fit with the guide rails 19 on the four sliding groove bodies 18. The four daughter board fixing screws 15 are tightly screwed, so that the daughter board assembly 4 is mounted.

In rail vehicle control relay board, since the daughter board assembly 4 employs the double-board structure, and the double boards of the double-board structure are in parallel with each other and perpendicular to the mother board 3, the daughter board assembly 4 is fixed to the daughter board mounting frame 2 and due to the arrangement structure of the daughter board mounting frame 2, the mounting strength of the daughter board assembly 4 is improved, a wiring space is enlarged, an arrangement number of the relays is increased, and loosening faults of the daughter board are reduced. Through the support columns 22 between the double boards, the strength of the daughter boards is further improved.

As shown in FIG. 7, the first daughter board 5 and the second daughter board 6 are electrically connected by two second connectors 10. One of the first daughter board 5 and the second daughter board 6 is electrically connected to the mother board 3 by a third connector 11.

In this embodiment, all of the daughter board assemblies 4 are electrically connected to the mother board 3, and the mother board 3 performs output to the outside via the first connectors 9 on the mother board 3.

The electric elements such as all of the relays 8 may be integrated on the first daughter board 5 and the second daughter board 6. Or, a part of the relays 8 are arranged on the board face mounting frame 1, and a part of the relays 8 are arranged on the first daughter board 5 and the second daughter board 6, as illustrated in FIG. 1.

As shown in FIG. 8, a knob 13, a daughter board serial number 14 and fault indicating lamps 16 are arranged at a front side of the daughter board mounting panel 7. The knob 13 is configured to facilitate the dismounting of the daughter board assembly 4. When the daughter board assembly 4 is disassembled, the daughter board assembly 4 may just be dismounted by pulling the knob 13. With the knob 13 and the guide rails 19 on the daughter board mounting frame 2, the mounting and dismounting of the daughter board assembly 4 are greatly facilitated. The daughter board serial number 14 is configured to distinguish the daughter board assemblies 4, and is arranged on the knob 13. For facilitating the determination of circuit fault of the relays 8, coils of the relays 8 in the daughter board assembly 4 are parallelly connected with the fault indicating lamps 16 respectively, wiring of the fault indicating lamps 16 is arranged on the daughter board assembly 4. With the fault indicating lamps 16, maintenance is facilitated.

Second Embodiment

Figure 10:
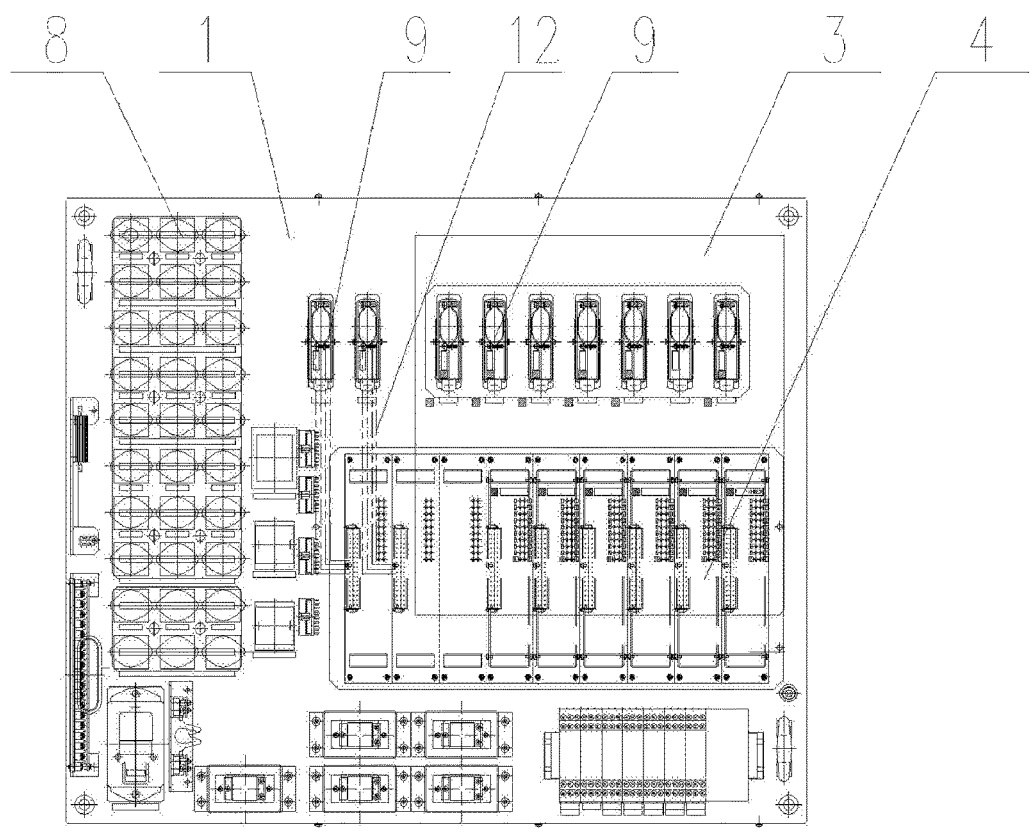
FIG. 10 is a schematic view showing the structure of a second embodiment.

As shown in FIG. 10, this embodiment is different from the first embodiment in that: a board face mounting frame 1 is also provided with multiple first connectors 9, and part of the multiple daughter board assemblies 4 are electrically connected to the mother board 3 by the third connectors 11 and perform output to the outside by the first connectors 9 of the mother board 3. And the other daughter board assemblies 4 are electrically connected to the first connector 9 on the board face mounting frame 1 by conducting wires 12. The conducting wires 12 reserve a sufficient length, and thus can be smoothly and conveniently connected to the daughter board assembly 4 even after the daughter board assembly 4 is dismounted.

Since the mother board 3 is a printed circuit board and has a fixed wiring, electric elements such as relays 8 which are determined to use or don't change (universal) are arranged on the daughter board assemblies 4 connected to the mother board 3, and electric elements such as relays 8 which are newly added or require to be changed according to requirements of different vehicle types are arranged on the daughter board assemblies 4 connected to the first connectors 9 on the board face mounting frame 1. In this way, when the control relay board is mounted in different types of vehicles or design is changed, the mother board 3 and the daughter board assembly 4 connected to the mother board 3 are not required to be changed, and simply the daughter board assemblies 4 connected to the first connectors 9 on the board face mounting frame 1 and the relays 8 arranged on the same need to be changed, thus, the cost is reduced, and a design cycle is shortened, and the versatility of this control relay board is improved.

Based on the above description, similar technical solutions can be made by referring to the content of solutions offered in the drawings. However, any simple changes, equivalent variations and modifications made to the above embodiments according to the technical essence of the present application, without departing from the content of the technical solutions of the present application, are deemed to fall into the scope of the technical solutions of the present application.

The invention claimed is:

1. A rail vehicle control relay board, comprising:
a main frame, and
a mother board and a daughter board assembly which are arranged in the main frame, wherein,
the main frame comprises a board face mounting frame and a daughter board mounting frame protruding from the board face mounting frame, the mother board is arranged in the board face mounting frame, a plurality of daughter board assemblies perpendicular to the mother board are arranged side by side in the daughter board mounting frame; and
the daughter board assemblies are electrically connected to the mother board, and a plurality of first connectors configured to perform output outwards are arranged on the mother board; wherein
the daughter board mounting frame comprises a cuboidal frame, the cuboidal frame and the board face mounting frame are integrally formed, and a plurality of sliding groove assemblies for inserting the daughter board assemblies are arranged side by side in the cuboidal frame.

2. The rail vehicle control relay board according to claim 1, wherein the board face mounting frame comprises a square box shaped body, and a bottom side of the square box-shaped body is a dismountable bottom board, and the mother board is connected inside the square box-shaped body by bolting.

3. The rail vehicle control relay board according to claim 2, wherein a plurality of first connectors are further provided on the board face mounting frame, part of the plurality of daughter board assemblies are electrically connected to the mother board, and the other daughter board assemblies are electrically connected to the first connectors on the board face mounting frame by conducting wires.

4. The rail vehicle control relay board according to claim 1, wherein each of the sliding groove assemblies comprises four sliding groove bodies, and side surfaces at two sides facing each other of the daughter board mounting frame are each provided with two sliding groove bodies, and each of the sliding groove bodies is provided with a guide rail used for inserting the daughter board assembly.

5. The rail vehicle control relay board according to claim 4, wherein a plurality of first connectors are further provided on the board face mounting frame, part of the plurality of daughter board assemblies are electrically connected to the mother board, and the other daughter board assemblies are electrically connected to the first connectors on the board face mounting frame by conducting wires.

6. The rail vehicle control relay board according to claim 1, wherein the daughter board assembly comprises a first daughter board and a second daughter board, the first daughter board and the second daughter board are in parallel with each other, a daughter board mounting panel is provided on a same side of the first daughter board and the second daughter board, and the daughter board mounting panel is fixed to the first daughter board and the second daughter board by bolting, respectively.

7. The rail vehicle control relay board according to claim 6, wherein the daughter board mounting panel is provided with two fixing faces which are in parallel with the first daughter board and the second daughter board respectively, and the first daughter board and the second daughter board are fixed to the two fixing faces by bolting, respectively.

8. The rail vehicle control relay board according to claim 7, wherein a plurality of first connectors are further provided on the board face mounting frame, part of the plurality of daughter board assemblies are electrically connected to the mother board, and the other daughter board assemblies are electrically connected to the first connectors on the board face mounting frame by conducting wires.

9. The rail vehicle control relay board according to claim 6, wherein the daughter board mounting panel is fixed to the daughter board mounting frame by bolting.

10. The rail vehicle control relay board according to claim 9, wherein a plurality of first connectors are further provided on the board face mounting frame, part of the plurality of daughter board assemblies are electrically connected to the mother board, and the other daughter board assemblies are electrically connected to the first connectors on the board face mounting frame by conducting wires.

11. The rail vehicle control relay board according to claim 6, wherein a plurality of support columns are provided between the first daughter board and the second daughter board, two ends of each of the support columns are each provided with a threaded hole, and the two ends of each of the support columns abut against the first daughter board and the second daughter board respectively, and the first daughter board and the second daughter board fix the support columns by bolts.

12. The rail vehicle control relay board according to claim 11, wherein a plurality of first connectors are further provided on the board face mounting frame, part of the plurality of daughter board assemblies are electrically connected to the mother board, and the other daughter board assemblies are electrically connected to the first connectors on the board face mounting frame by conducting wires.

13. The rail vehicle control relay board according to claim 6, wherein the first daughter board is in circuit connection with the second daughter board by second connectors.

14. The rail vehicle control relay board according to claim 13, wherein the first daughter board or the second daughter board is electrically connected to the mother board by a third connector.

15. The rail vehicle control relay board according to claim 14, wherein a plurality of first connectors are further provided on the board face mounting frame, part of the plurality of daughter board assemblies are electrically connected to the mother board, and the other daughter board assemblies are electrically connected to the first connectors on the board face mounting frame by conducting wires.

16. The rail vehicle control relay board according to claim 13, wherein a plurality of first connectors are further provided on the board face mounting frame, part of the plurality of daughter board assemblies are electrically connected to the mother board, and the other daughter board assemblies are electrically connected to the first connectors on the board face mounting frame by conducting wires.

17. The rail vehicle control relay board according to claim 6, wherein a plurality of first connectors are further provided on the board face mounting frame, part of the plurality of daughter board assemblies are electrically connected to the mother board, and the other daughter board assemblies are electrically connected to the first connectors on the board face mounting frame by conducting wires.

18. The rail vehicle control relay board according to claim 1, wherein a plurality of first connectors are further provided on the board face mounting frame, part of the plurality of daughter board assemblies are electrically connected to the mother board, and the other daughter board assemblies are electrically connected to the first connectors on the board face mounting frame by conducting wires.

* * * * *